United States Patent

Noguchi

[11] Patent Number: 5,914,682
[45] Date of Patent: Jun. 22, 1999

[54] SEGMENTWISE OPERATING DIGITAL-TO-ANALOG CONVERTER

[75] Inventor: Yasunori Noguchi, Kyoto, Japan

[73] Assignee: Rohm Co. Ltd., Kyoto, Japan

[21] Appl. No.: 08/834,804

[22] Filed: Apr. 3, 1997

[30]     Foreign Application Priority Data

Apr. 3, 1996   [JP]   Japan .................................. 8-081395

[51] Int. Cl.⁶ .................................................. H03M 1/68
[52] U.S. Cl. .......................................... 341/145; 341/118
[58] Field of Search ................................... 341/144, 145, 341/136, 118

[56]           References Cited

U.S. PATENT DOCUMENTS

| | | | |
|---|---|---|---|
| 4,868,571 | 9/1989 | Inamasu | 341/118 |
| 4,998,108 | 3/1991 | Ginthner et al. | 341/145 |
| 5,270,716 | 12/1993 | Gleim | 341/145 |
| 5,323,159 | 6/1994 | Imamura et al. | 341/145 |

*Primary Examiner*—Marc S. Hoff
*Attorney, Agent, or Firm*—Nikaido Marmelstein Murray & Oram, LLP

[57]           ABSTRACT

A segmentwise-operating D/A converter has the first and second D/A conversion circuits. Input digital data containing a plurality of bits is divided into two segments. The digital data of one segment is processed by the first D/A conversion circuit to be converted into analog signal. The digital data of another segment is processed by the second D/A conversion circuit to be converted into analog signal. Outputs from the first and second D/A conversion circuits are added together. The full-scale value of the D/A conversion circuit of one segment is set to be more than the full-scale value of the D/A conversion circuit of an adjacent segment divided by the N-th power of two (N represents the number of bits contained in one segment).

5 Claims, 9 Drawing Sheets

SEGMENTWISE OPERATING DIGITAL-TO-ANALOG CONVERTER

BACKGROUND OF THE INVENTION

1. Field of the Invention

The present invention relates to a digital-to-analog converter (hereinafter also referred to as a D/A converter) that operates segmentwise.

2. Description of the Prior Art

Some conventional D/A converters have been known as "segmentwise operating D/A converters". When processing input digital data including n bits, D/A converters of this type divide the digital data into two segments (groups), that is, into the upper bits (MSB) and the lower bits (LSB), then subject each segment to D/A conversion, and finally add up the outputs of D/A conversion of each segment.

However, D/A converters of this type have the following shortcoming. FIG. 1 shows the input/output characteristic of such a D/A converter, with the value of input digital data taken along the horizontal axis and the output voltage (analog voltage) taken along the vertical axis. As seen from this figure, conventional segmentwise operating D/A converters suffer from abrupt rising changes in their output voltage at some points, such as the points 52, 53, and 54 in FIG. 1, within their conversion range. Such abrupt rising changes in the output voltage occur when the lower bits change (at the points 52, 53, and 54) from the state in which all the bits are "1" to the state in which all the bits are "0" due to increment of the input digital data. Because of such abrupt rising changes, a control device employing a D/A converter of this type cannot achieve proper control when a voltage that exists within the range of such abrupt changes is targeted as the voltage expected from the D/A converter. To minimize such changes, the D/A converter needs to be composed of high-precision circuits, and this has been making the D/A converter (and thus the control device employing it) more expensive to produce. Abrupt rising changes as described above in the output voltage at the points 52, 53, and 54 (the points 52, 53, and 54 are generally called the segment switching points) occur mainly because the full-scale value Vd of the D/A conversion circuit for the lower-bits segment is determined such that this full-scale value Vd, when incremented by one LSB, equals the full-scale value Vu of the D/A converting circuit for the upper-bits segment divided by $2^N$ (N represents the number of the upper bits). That is, $Vd=(Vu/2^N)-1LSB$.

SUMMARY OF THE INVENTION

An object of the present invention is to provide a segmentwise D/A converter that can be produced inexpensively and that can be suitably used for highly accurate control.

Another object of the present invention is to provide a control device using such a D/A converter.

To achieve the above objects, according to the present invention, in a segmentwise-operating digital-to-analog converter that divides digital data containing a plurality of bits into more than one segment, subjects digital data of each segment to digital-to-analog conversion by a digital-to-analog conversion means provided for each segment, and adds together outputs from all of the digital-to-analog conversion means, a full-scale output of a digital-to-analog conversion means for a lower segment is more than a full-scale output of a digital-to-analog conversion means for an upper adjacent segment divided by an N-th power of two (N represents a number of bits contained in the upper adjacent segment).

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
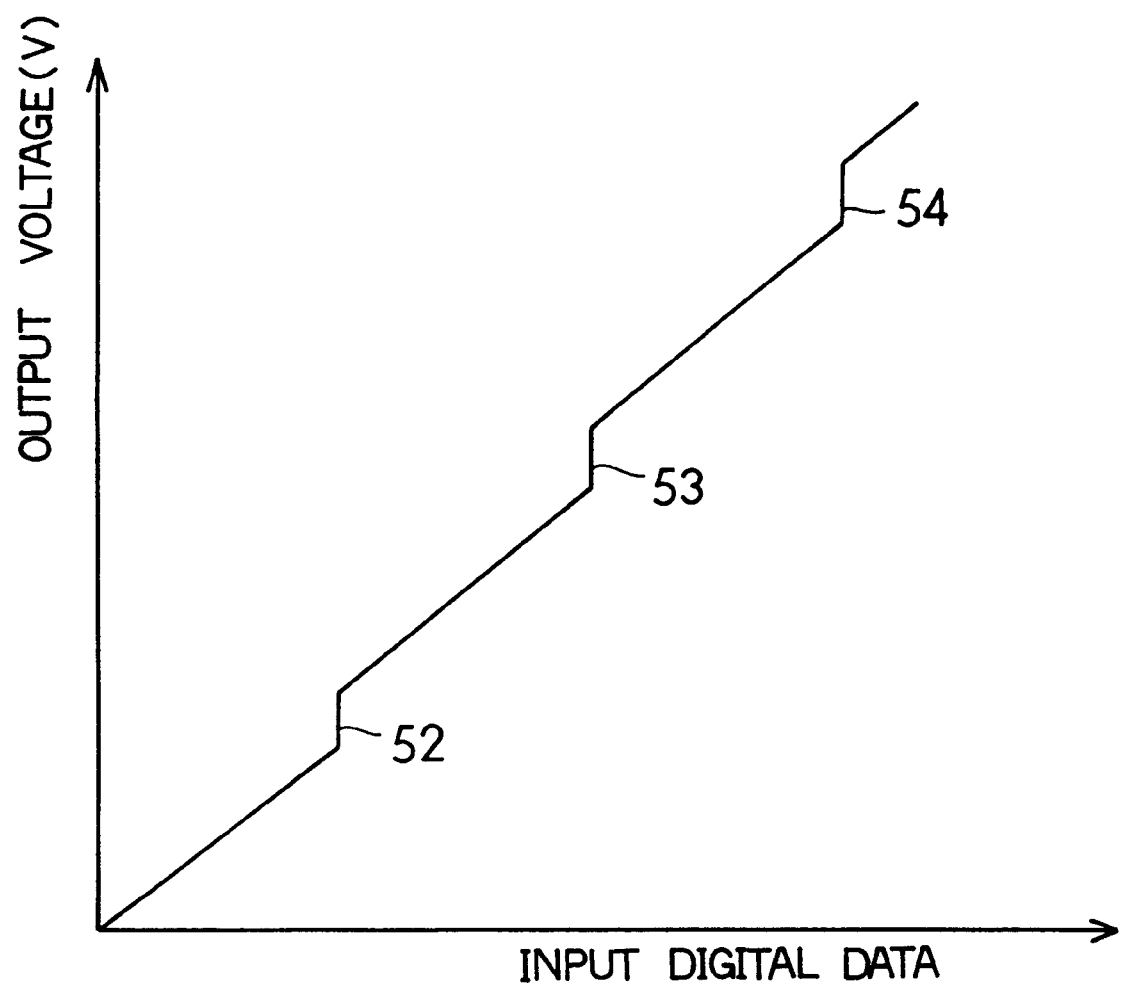
FIG. 1 is a chart showing the characteristic of a conventional D/A converter.
Figure 2:
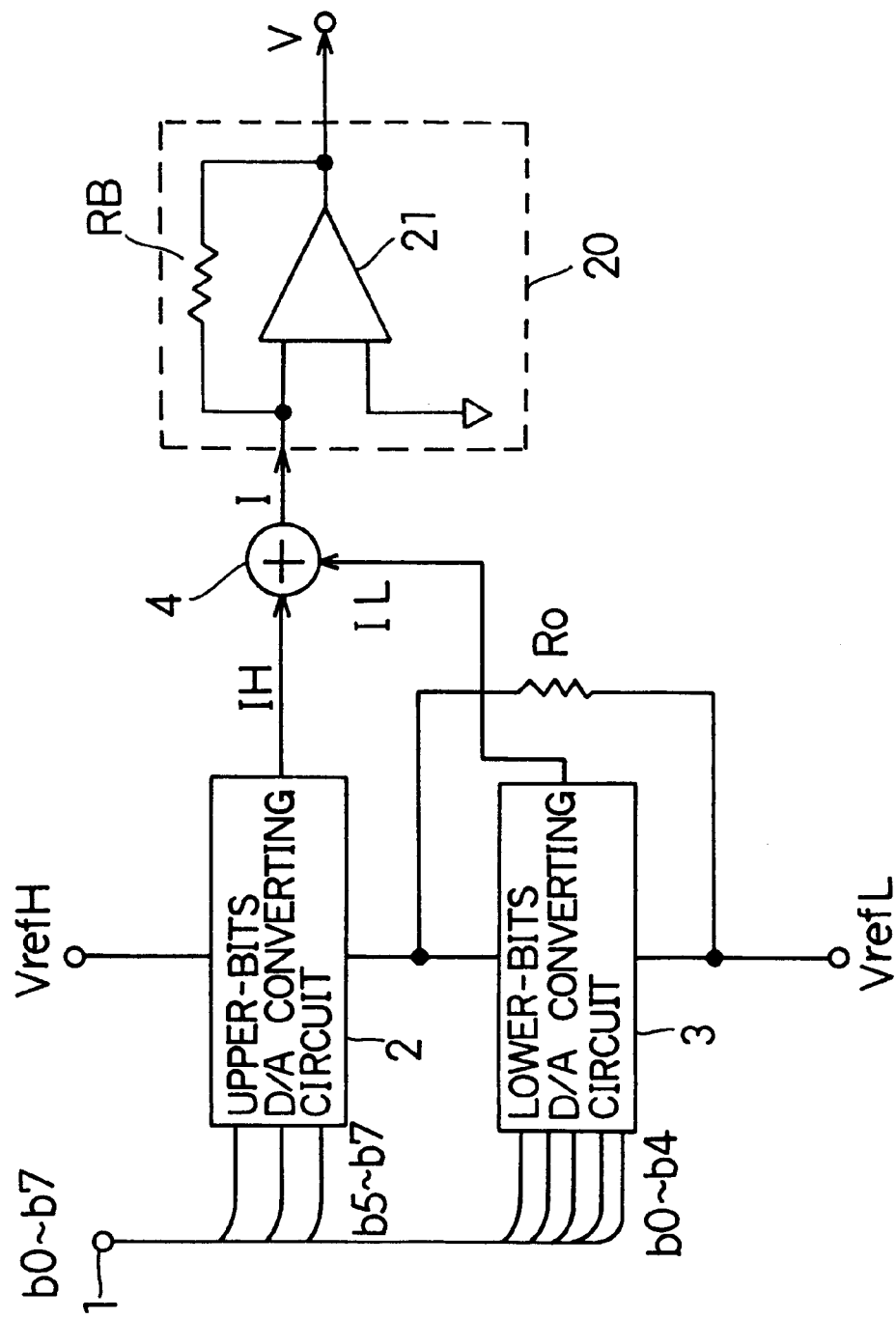
FIG. 2 is a block diagram of a D/A converter as a first embodiment of the present invention.

Hereinafter, embodiments of the present invention will be described with reference to the drawings. FIG. 2 is a block diagram of a D/A converter as a first embodiment of the present invention. This D/A converter receives eight-bit digital data (containing eight bits b0 to b7) via an input terminal 1. Of the eight bits, the bit b0 is the lowest bit, the bit b1 is the second lowest bit, and so forth; the bit b7 is the highest bit.

The segment of the upper bits b5 to b7 is transferred to an upper-bits D/A conversion circuit 2, and the segment of the lower bits b0 to b4 are transferred to a lower-bits D/A conversion circuit 3. The D/A conversion circuits 2 and 3 individually convert input digital data into an analog current. For example, such a D/A conversion circuit is typically provided with a plurality of constant current sources, so that currents corresponding to input digital data are extracted from those current sources.

The upper-bits D/A conversion circuit 2 is connected to a high-voltage constant voltage VrefH. The lower-bits D/A conversion circuit 3 is connected to the upper-bits D/A conversion circuit 2 on the one hand, and to a low-voltage constant voltage VrefL on the other. The voltage VrefL may be a ground voltage. In parallel with the lower-bits D/A conversion circuit 3, a resistor $R_0$ is connected. The description of the resistor $R_0$ will be given later.

The upper-bits and lower-bits D/A conversion circuits 2 and 3 are supplied with power by the constant voltages VrefH and VrefL to perform digital-to-analog conversion on input digital data. Specifically, the upper-bits D/A conversion circuit 2 outputs a current IH that corresponds to the data represented by the upper bits b5 to b7, and the lower-bits D/A conversion circuit 3 outputs a current IL that corresponds to the data represented by the lower bits b0 to b4. The currents IH and IL are added together by a current adder 4 into a current I.

The current I is fed to an integrator 20. The integrator 20 converts the current I into a voltage V. Specifically, the integrator 20 consists of an operational amplifier 21 and a feedback resistor RB, and outputs a voltage V that equals the product of the current I by the resistor RB. The D/A conversion circuits 2 and 3 are composed of resistors and other elements having constants that are similar between the two D/A conversion circuits. This implies that segmentwise D/A converters, such as the one under discussion, are easily integrated into an integrated circuit, with reduced variations in the characteristics of the elements composing the integrated circuit.

In this D/A converter, the current I obtained by adding together the current IL output from the lower-bits D/A conversion circuit 3 and the current IH output from the upper-bits D/A conversion circuit 2 needs to correspond to the original 8-bit digital data b0 to b7 mentioned above. To achieve this, the voltage applied to the lower-bits D/A conversion circuit 3 is adjusted by setting the resistor $R_0$ to have a proper resistance. Specifically, the resistance of the resistor $R_0$ is determined such that the full-scale magnitude of the current IL output from the lower-bits D/A conversion circuit 3 is set to be more than the full-scale magnitude of the current IH output from the upper-bits D/A conversion circuit 2 divided by two to the power of the number of the upper bits b5 to b7 (that is, divided by the third power of two, i.e. eight).

Figure 3:
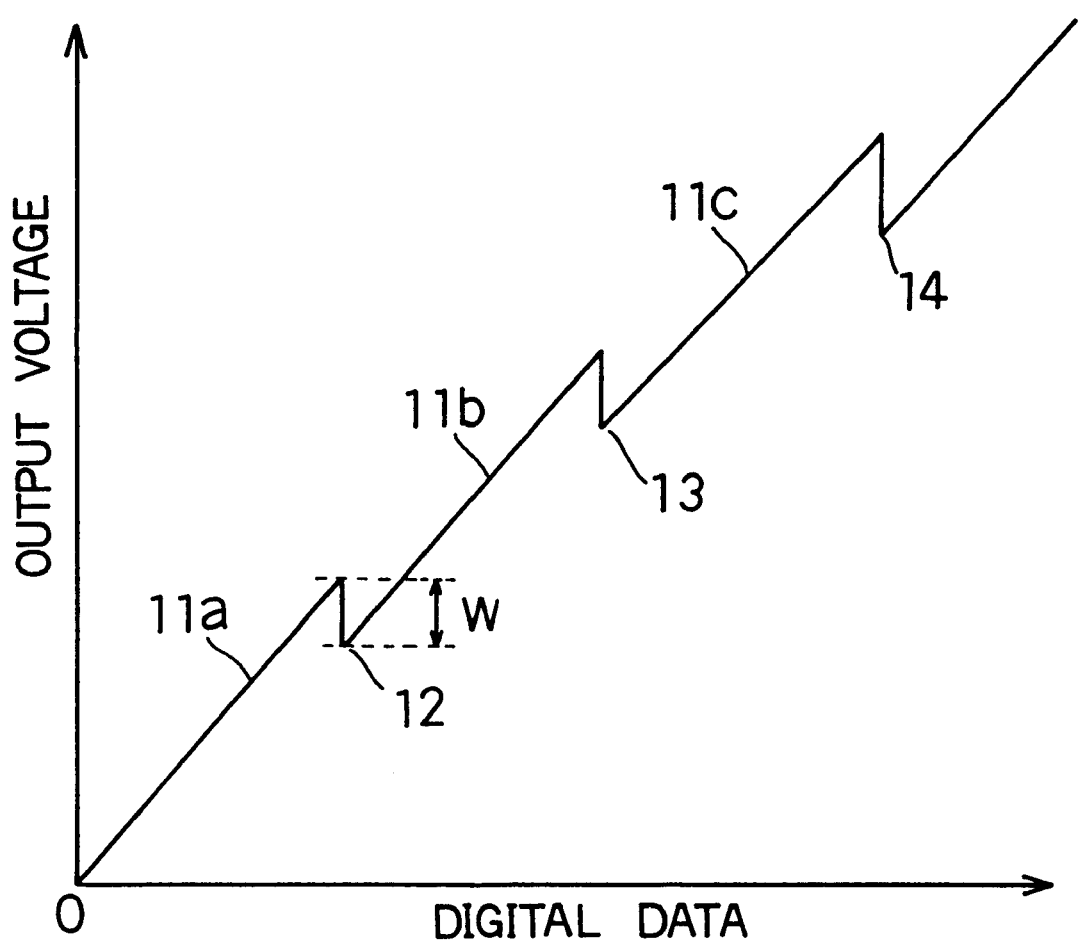
FIG. 3 is a chart showing the characteristic of the D/A converter of the first embodiment.

FIG. 3 is a chart showing the D/A conversion characteristic of the D/A converter under discussion. When the digital data is zero, neither the upper-bits D/A conversion circuit 2 nor the lower-bits D/A conversion circuit 3 outputs a current. Accordingly, at this time, the current I is not present, and thus the output voltage V is zero. As the digital data is successively incremented by one at a time, starting from zero, then, while the digital data is within 11a, the lower bits b0 to b4 reflect the increments, and the lower-bits D/A conversion circuit 3 increases its output current IL in accordance with the digital data. Meanwhile, since the upper bits b5 to b7 remain unchanged, the current IH is not present, and thus the total current I remains equal to IL. If the lower-bits D/A conversion circuit 3 has a linear output characteristic, the current I increases in direct proportion to the digital data (11 in FIG. 3).

In this embodiment, the full-scale magnitude of the current output from the lower-bits D/A conversion circuit 3 is set to be more than the full-scale magnitude of the current output from the lower-bits D/A conversion circuit 2 divided by the third power of two (i.e. eight). Accordingly, at segment switching points (such as 12, 13, and 14 in FIG. 3), the output current I drops. This means that, at segment switching points, the output voltage V drops.

Since a large error is allowed in the negative direction at the points 12, 13, and 14, the constant of the resistor $R_0$ can be set with a relatively ample margin. This eliminates the need to fine-tune the resistor R, and thus reduces the cost of the D/A converter. When the D/A converter is integrated into an integrated circuit, the integrator 20 may be incorporated into the integrated circuit, or may be provided externally.

The differential non-linear error is kept within one LSB over the conversion ranges 11a, 11b, and 11c. These mean that the output voltage V can be controlled with an accuracy within one LSB with respect to a reference voltage that is targeted in a control operation.

One LSB here represents the variation in magnitude of a current that corresponds to an increment or decrement in digital data, supposing that the current, i.e. IH or IL, can vary continuously from its full-scale magnitude. Specifically, one LSB corresponds to the full-scale magnitude of the current IL divided by the fifth power of two (i.e. 32), because the lower bits b0 to b4 contain five bits.

Figure 4:
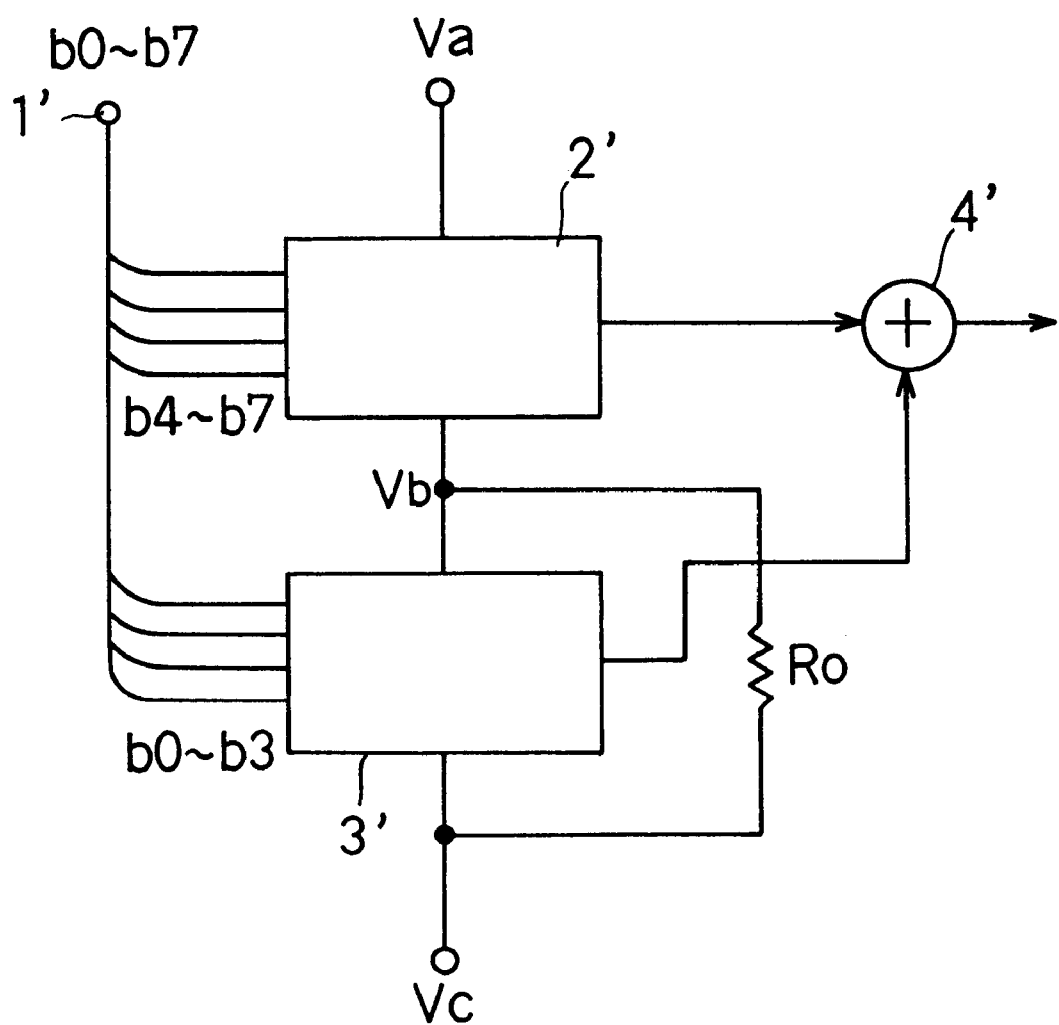
FIG. 4 is a block diagram of another D/A converter as a second embodiment of the present invention.
Figure 5:
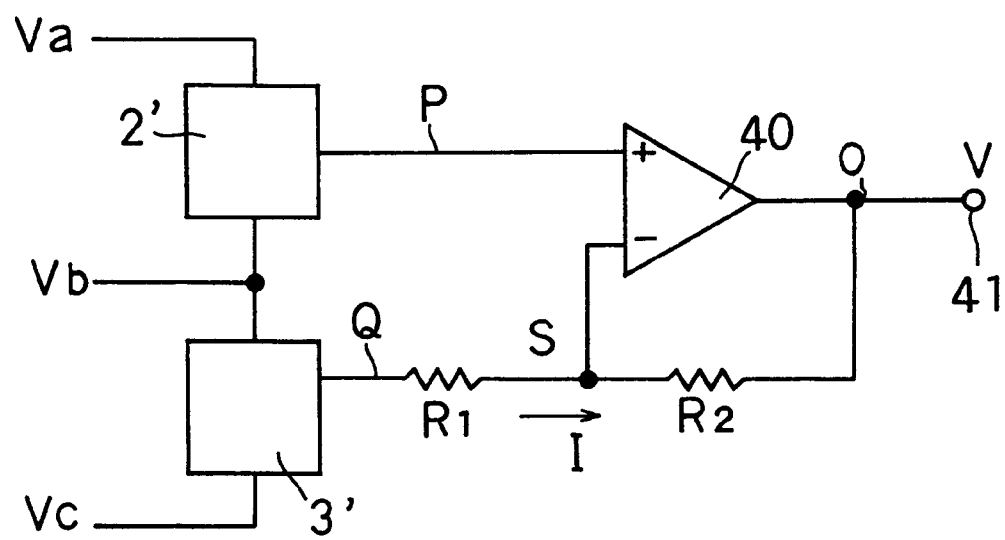
FIG. 5 is a construction diagram specifically showing a part of FIG. 4.
Figure 6:
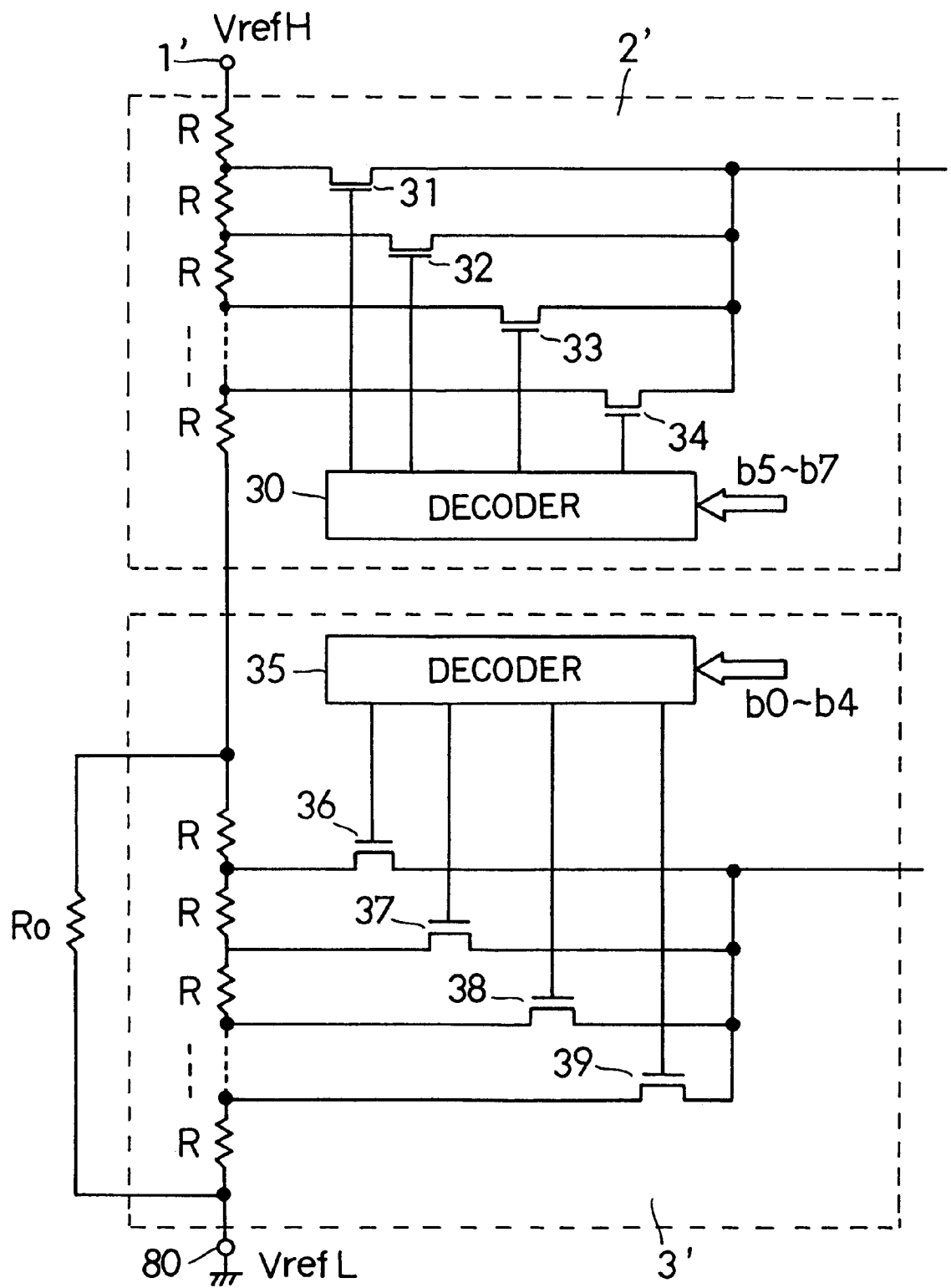
FIG. 6 is a detail diagram showing the D/A conversion circuit in FIG. 4.

FIGS. 4 to 6 show a second embodiment of the present invention. In FIG. 4, numeral 1' represents an input terminal at which 8-bit digital data b0 to b7 is input. Numeral 2' represents an upper-bits D/A conversion circuit for the upper bits b4 to b7, and numeral 3' represents a lower-bits D/A conversion circuit for the lower bits b0 to b3. Numeral 4' represents a synthesizing circuit for synthesizing the outputs of the D/A conversion circuits 2' and 3'. Va represents a high-level constant voltage, and Vc represents a low-level constant voltage. The voltage Vc may be a ground voltage. $R_0$ represents a resistor that determines the voltage Vb-Vc applied to the lower-bits D/A conversion circuit 3'.

An example of the construction of the D/A conversion circuits 2' and 3' is shown in FIG. 6. In FIG. 6, a plurality of resistors R having the same resistance are connected in series between the terminal 1' and a ground terminal 80. To the nodes between these resistors are connected, one to one, MOS transistors 31 to 34 and 36 to 39 for switching. Although only eight transistors are shown in the figure, 32 transistors in total are provided in practice. Of these transistors, 16 transistors are allocated to the D/A conversion circuit 2', and 16 transistors are allocated to the D/A conversion circuit 3'. Numeral 30 represents a decoder for the upper bits b4 to b7. In accordance with the output of this decoder 30, one of the 16 transistors in the D/A conversion circuit 2' is turned on, or, in some cases, all of them are turned off. Numeral 35 represents a decoder for the lower bits b0 to b3. In accordance with the output of this decoder 35, one of the 16 transistors in the D/A conversion circuit 3' is turned on, or, in some cases, all of them are turned off.

Next, how the voltage Vb-Vc is determined will be described with reference to FIG. 5. In FIG. 5, numeral 40 represents an operational amplifier, and numeral 41 represents an output terminal. Assume now that the current flowing from point Q to point 0 is I, and that the voltages at points P and Q are $V_P$ and $V_Q$, respectively. Then, $$V=V_Q-(R_1+R_2)I \qquad (1)$$

Since the amplifier 40 operates to make the voltage $V_S$ at its inverting input terminal (−) equal to the voltage $V_P$ at its non-inverting input terminal (+), $$I=(V_Q-V_S)/R_1=(V_Q-V_P)/R_1 \qquad (2)$$

Substituting expression (2) in (1), we obtain $$V=V_Q(R_1+R_2)(V_Q-V_P)/R_1$$

Further, assuming $R_1=R_2$, we obtain $$V=2V_P-V_Q$$

This shows that the amplifier 40 has an amplification factor of two when point O is considered with respect to point P, but that the same amplifier 40 has an amplification factor of one when point O is considered with respect to point Q. Accordingly, the voltage Vb-Vc should be expressed not as $$Vb-Vc>(Va-Vb)/2^4 \qquad (3)$$

but instead as $$Vb-Vc>(Va-Vb)\times 2/2^4 \qquad (4)$$

Note however that expression (3) holds if the synthesizing circuit 4' uses an amplifier that amplifies both $V_P$ and $V_Q$ with the same amplification factor of one. In the second embodiment under discussion, the constant of the resistor $R_0$ is so determined that expression (4) is satisfied. Expressions (3) and (4) can be expressed in a single, more general expression:

$$Vb-Vc > (Va-Vb)M/2^N \quad (5)$$

where M represents the synthesis ratio with which the synthesizing circuit 4' synthesizes the outputs of the upper-bits D/A conversion circuit 2' and the lower-bits D/A conversion circuit 3', and N represents the number of the upper bits. Here, Vb-Vc corresponds to the full-scale output of the lower-bits D/A conversion circuit 3' and Va-Vb corresponds to the full-scale output of the upper-bits D/A conversion circuit 2'. When expression (5) is satisfied, the input/output characteristic is as shown in FIG. 3, that is, dropping changes occur in the output voltage at the switching points 12, 13, and 14. In expression (5), as the difference between the left and right sides increases, the range W of the change at the points 12, 13, and 14 in FIG. 3 widens. Accordingly, the difference between the two sides needs to be set to an appropriate value. If the D/A converter has the input/output characteristic shown in FIG. 3, it is possible to target a voltage that exists within the range W of, for example, the abrupt dropping change at the point 12, because such a voltage is covered in the linear range 11*a*. Similarly, a voltage that exists within the range of the change at the points 13 and 14 is covered in the linear ranges 11*b* and 11*c*, respectively.

Figure 7:
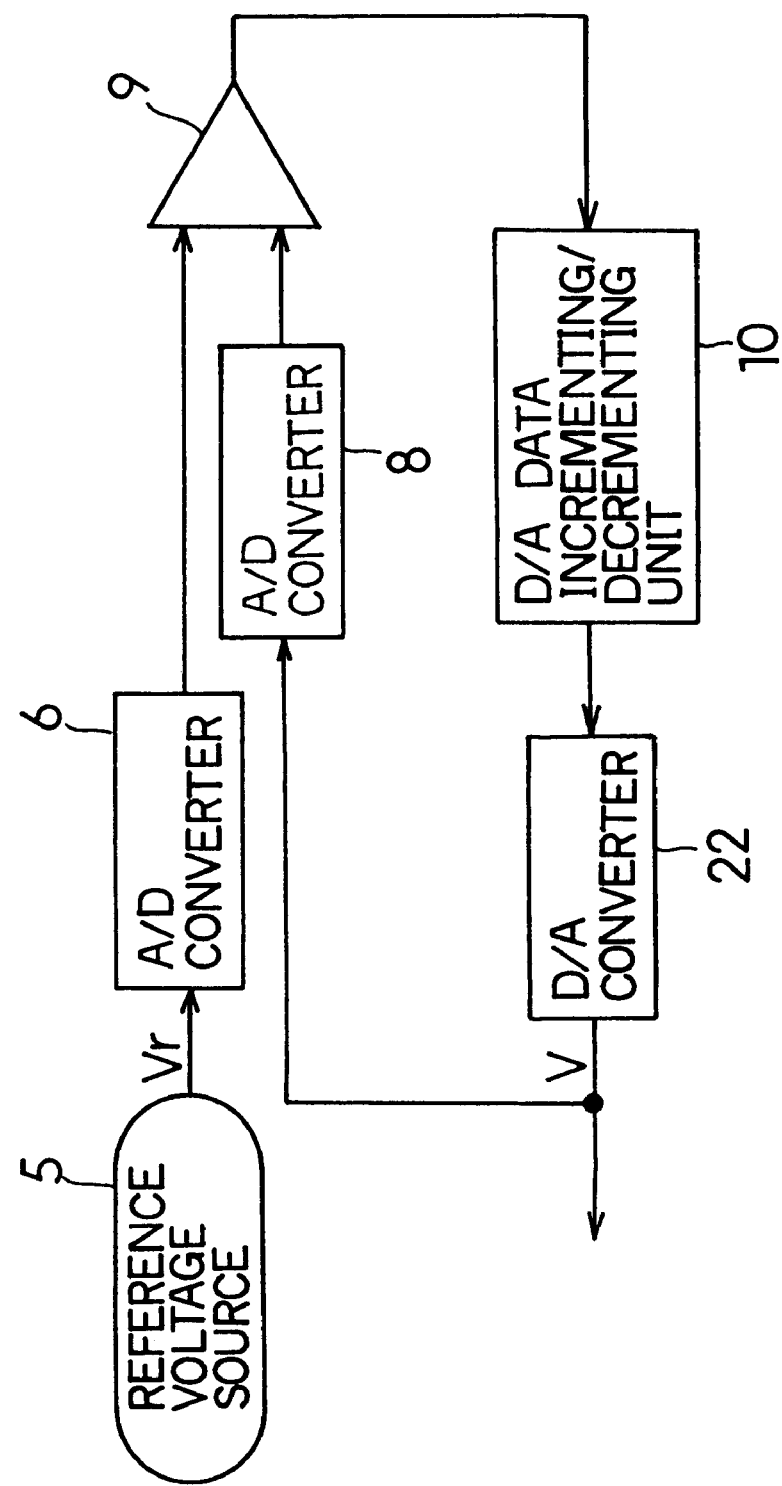
FIG. 7 is a block diagram of a control device employing the D/A converter of the present invention.

FIG. 7 is a block diagram of an automatic control device. This control device uses the D/A converter 22 according to the present invention, and automatically sets the voltage output from the D/A converter 22 by comparing it with a reference voltage Vr from a reference voltage source 5. The D/A converter 22 keeps the differential non-linear error within one LSB in the positive direction over the entire conversion range.

Here, the differential non-linear error corresponds to the maximum difference between the ideal output voltage and the actual output voltage. One LSB corresponds to the amount of the change of the output voltage or output current when the input digital data changes by one.

This control device operates as follows. A D/A data incrementing/decrementing unit 10 supplies digital data to the D/A converter 22, which performs digital-to-analog conversion on the digital data and outputs a voltage V. This voltage V is then converted into a digital signal by an A/D converter 8, and fed to a comparator 9. On the other hand, the reference voltage Vr is also converted into a digital signal by another A/D converter 6, and is fed to the comparator 9.

The comparator 9 compares the voltage V with the reference voltage Vr to check whether the voltage V is higher than, equal to, or lower than the reference voltage Vr. In accordance with the check result fed from the comparator 9, the D/A data incrementing/decrementing unit 10 increments the digital data when the voltage V is lower than the reference voltage Vr, or decrements the digital data when the voltage V is higher than the reference voltage Vr. When the voltage V is equal to the reference voltage Vr, the D/A data incrementing/decrementing unit 10 neither increments nor decrements the digital data but keeps it unchanged.

For example, assume that the digital data output from the D/A data incrementing/decrementing unit 10 is initially set to zero, whereas the reference voltage Vr is set to a particular positive voltage. At first, since the D/A converter 11 outputs no voltage, the voltage V is determined to be lower than the reference voltage Vr. This causes the D/A data incrementing/decrementing unit 10 to increment the digital data to one, and thus causes the D/A converter 22 to start outputting a voltage. As long as the voltage V is lower than the reference voltage Vr, the comparator 9 continues to determine the voltage V to be lower than the reference voltage Vr, and thus the D/A data incrementing/decrementing unit 10 continues to increment the digital data. This is repeated until the voltage V becomes equal to or higher than the reference voltage Vr.

Eventually, when the output voltage V becomes equal to the reference voltage Vr, the voltage V is kept equal to the reference voltage Vr. When the output voltage V becomes not equal to but higher than the reference voltage Vr, the D/A data incrementing/decrementing unit 10 repeats incrementing and decrementing the digital data, as if oscillating it, so that the output voltage V varies around the reference voltage Vr. Even in such a case, the variation of the output voltage V is minimized, because the differential non-linear error is kept within one LSB. Moreover, in this way, the output voltage V can be controlled without any dependence on the digital data that is initially output from the D/A data incrementing/decrementing unit 10.

As described above, it is possible to achieve high-precision control of the output voltage V with respect to the reference voltage Vr, without using a high-precision D/A converter. The output voltage V may deviate appreciably at segment switching points (such as 12, 13, and 14 in FIG. 3), but this does not cause any problem as long as the D/A converter is so controlled as to output a voltage that equals to a predetermined reference voltage, since the output voltage can be controlled with an accuracy within one LSB at any time.

Moreover, it is also possible to modify the data obtained as a result of analog-to-digital conversion by the A/D converters 6 and 8 before using the data for the control of the output voltage. For example, by multiplying by a specific factor the reference voltage Vr, which is obtained as a result of analog-to-digital conversion by the A/D converter 6, before the voltage is used for control, it is possible to control the output voltage V of the D/A converter 22 with an accordingly low reference voltage. Furthermore, it is possible to use a parameter other than a voltage as the reference for the control of the output voltage, provided that the parameter can be converted into a digital signal in some way; for example, the reference parameter may be a current magnitude, resistance, or even a digital signal itself.

Figure 8:
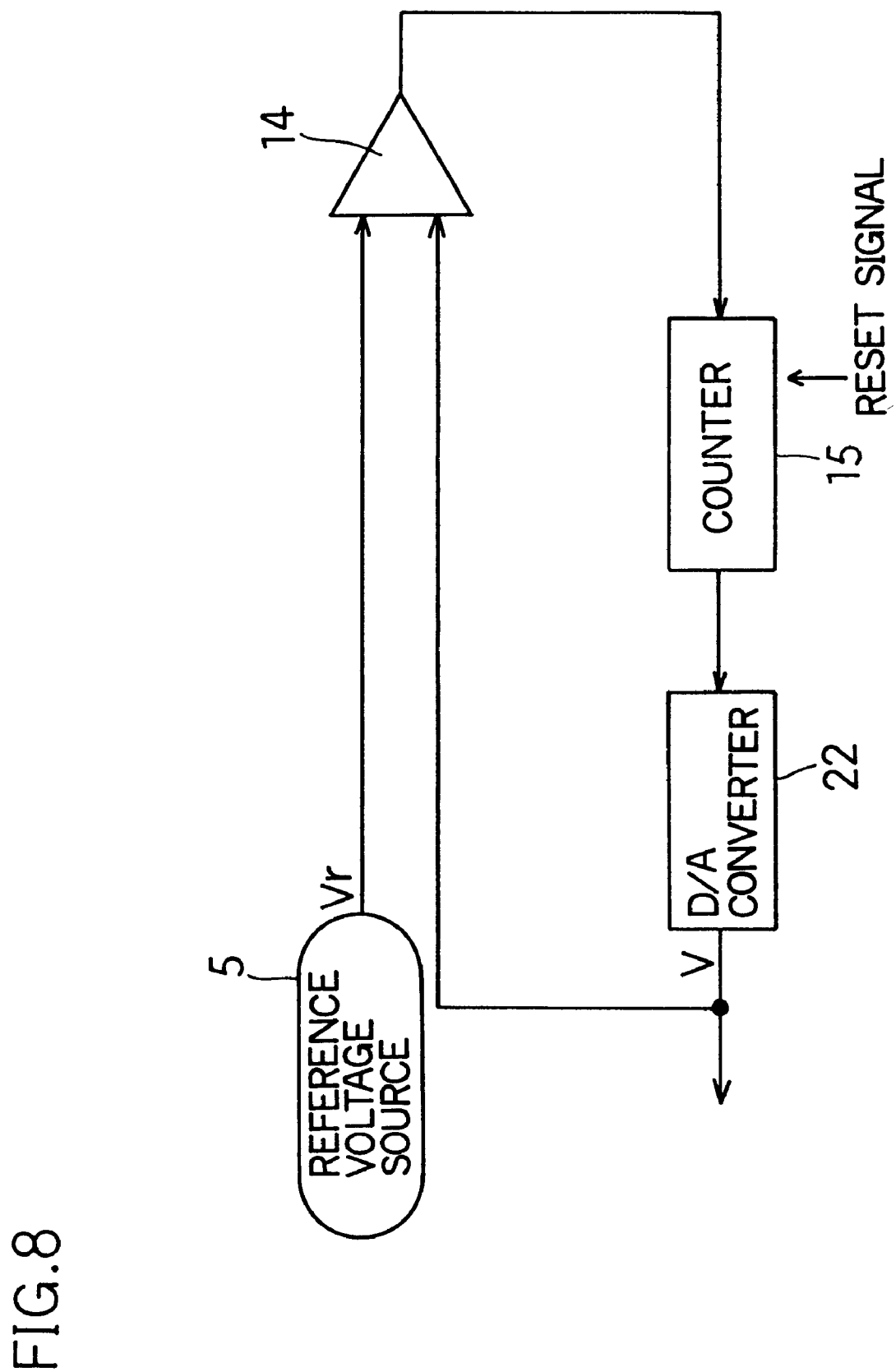
FIG. 8 is a block diagram of another control device employing the D/A converter of the present invention.

FIG. 8 is a block diagram of another automatic control device of the present invention. This control device also uses the D/A converter 22 according to the present invention. In FIG. 8, such elements as are found in FIG. 7 are identified with the same designations, and the description of those elements will not be repeated. The output voltage V of the D/A converter 22 is fed to a comparator 14, which compares the voltage V with the voltage Vr of a reference voltage source 5.

When the output voltage V is lower than the reference voltage Vr, the comparator 14 outputs a high level, and the digital data output from a counter 15 is incremented by one. This causes the D/A converter 22 to increase its output voltage V. The digital data is incremented in this way until the voltage V becomes higher than the reference voltage Vr. When the output voltage V exceeds the reference voltage Vr, the comparator 14 outputs a low level, and the digital data output from the counter 15 is kept unchanged.

Thereafter, the output voltage V of the D/A converter 22 is kept constant, and thus a constant voltage V is supplied to a load (not shown). The counter 15 here is not capable of decrementing the digital data output therefrom, and therefore a reset signal needs to be fed to the counter 15 when the digital data needs to be reset to zero. Accordingly, in this control device, the digital data output from the counter 15 is first reset to zero by feeding the counter 15 with a reset signal, and then the voltage V output from the D/A converter 22 is gradually increased until it becomes equal to the reference voltage Vr.

Figure 9:
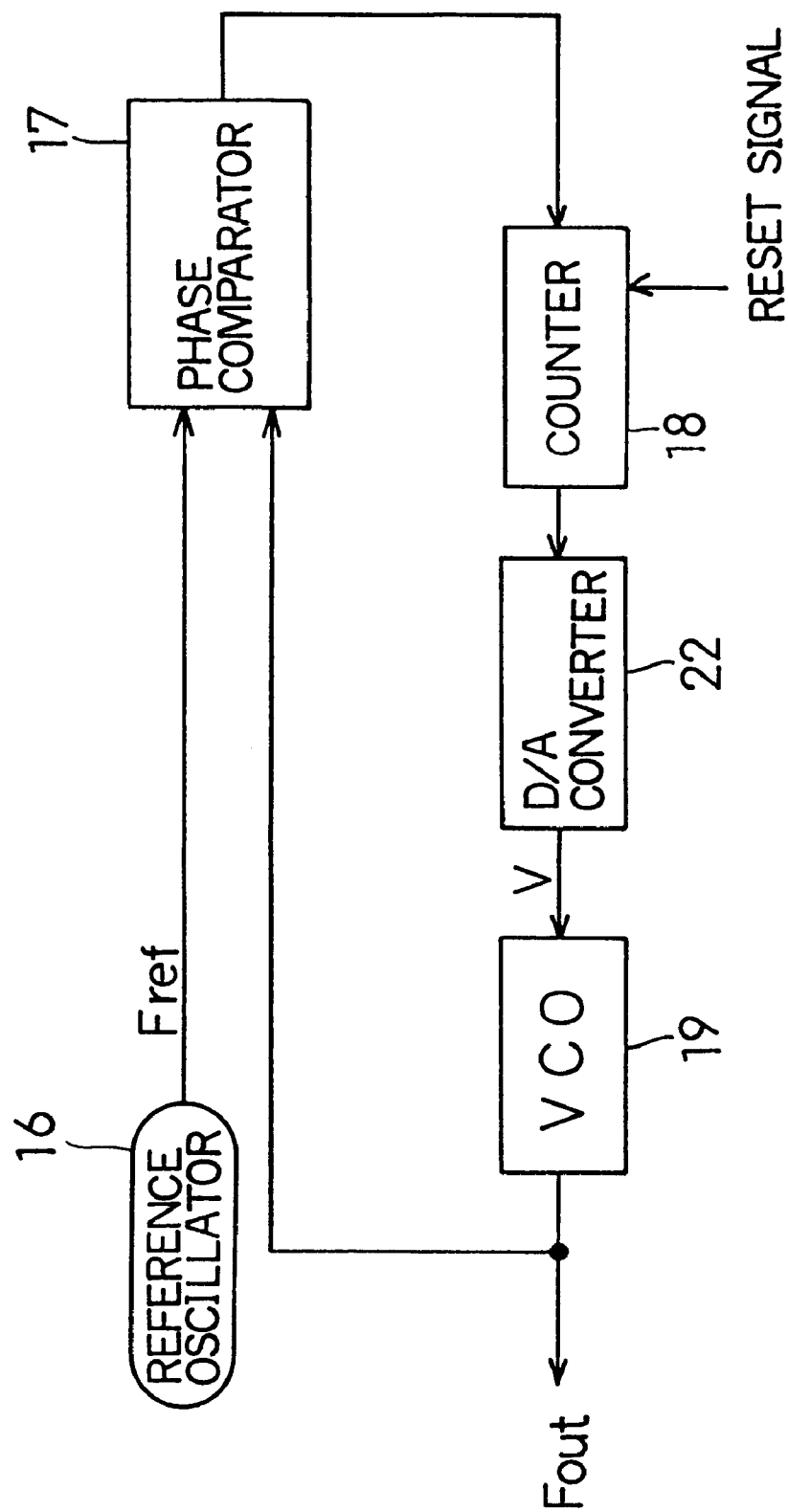
FIG. 9 is a block diagram of still another control device employing the D/A converter of the present invention.

FIG. 9 is a block diagram of still another automatic control device of the present invention. In FIG. 9, such elements as are found in FIG. 7 are identified with the same designations, and the description of those elements will not be repeated. In FIG. 9, the voltage-controlled oscillator (VCO) 19 is an oscillator whose oscillation frequency can be controlled by a voltage supplied thereto, and specifically its oscillation frequency rises as the voltage rises.

When a reset signal is fed to a counter 18, the counter 18 outputs digital data representing a minimum value, so that a D/A converter 22 outputs a minimum voltage V. The minimum value of the digital data is so determined that the voltage-controlled oscillator 19 oscillates at its minimum oscillation frequency when the digital data has that value. The oscillation output Fout is fed to a phase comparator 17.

The phase comparator 17 compares the frequency of the oscillation output Fout of the voltage-controlled oscillator 19 with the reference frequency Fref of a reference oscillator 16. If Fout is lower than Fref, the phase comparator 17 generates a pulse, and feeds it to the counter 18. When the counter 18 receives the pulse, it increments the digital data by one. This causes the D/A converter 22 to raise its output voltage V, and thus causes the voltage-controlled oscillator 19 to raise its oscillation frequency Fout.

This is repeated, and accordingly Fout, starting from the minimum oscillation frequency, rises gradually. When Fout becomes equal to or higher than Fref, the phase comparator 17 stops generating a pulse, and thus the frequency Fout is kept fixed. Here, the oscillation frequency Fout is fixed at a frequency close to the reference frequency Fref. In other words, for the same reason as given in connection with the third embodiment described above, it never happens that the oscillation frequency Fout is fixed at a frequency far higher than the reference frequency Fref.

The control device of the embodiment under discussion is a kind of PLL (phase locked loop) circuit, and can be used, for example, as an oscillator for oscillating an audio carrier in a high-fidelity videocassette recorder. In this way, it is possible by the use of the low-cost D/A converter according to the present invention to control the voltage-controlled oscillator 19 with an accuracy close to that achieved by the use of an expensive D/A converter.

What is claimed is:

1. A control device comprising:
    a reference signal generator generating a reference signal.
    a digital-to-analog converter.
    comparing means for comparing the reference signal with an output of the digital-to-analog converter to control the digital-to-analog converter,
    wherein the digital-to-analog converter is a segmentwise-operating digital-to-analog converter which subjects digital data of each segment to digital-to-analog conversion by a digital-to-analog conversion means provided for each segment, and which adds together outputs from all of the digital-to-analog conversion means, wherein a full-scale output of a digital-to-analog conversion means for one segment is more than a full-scale output of a digital-to-analog conversion means for an adjacent segment divided by an N-th power of two, where N represents a number of bits contained in said one segment,
    wherein the reference signal is a reference frequency,
    wherein a voltage-controlled oscillator is provided whose frequency is controlled by an output of the digital-to-analog converter, and
    wherein the comparing means compares the reference frequency and an oscillation frequency of the voltage-controlled oscillator.

2. A digital-to-analog converter, comprising:
    a first digital-to-analog conversion circuit for processing upper bits of input digital data, the first digital-to-analog conversion circuit including:
        a first terminal for receiving a first voltage,
        a first resistor circuit composed of a plurality of resistors having a same resistance and connected in series, one end of the first resistor circuit being connected to the first terminal,
        a plurality of switches of which each is connected at one end to a different node between the resistors in the first resistor circuit, and
        first connecting means for connecting another end of each of the plurality of switches;
    a second digital-to-analog conversion circuit for processing lower bits of the input digital data, the second digital-to-analog conversion circuit including:
        a second terminal for receiving a second voltage that is lower than the first voltage,
        a second resistor circuit composed of a plurality of resistors having a same resistance and connected in series, one end of the second resistor circuit being connected to another end of the first resistor circuit, another end of the second resistor circuit being connected to the second terminal,
        a plurality of switches of which each is connected at one end to a different node between the resistors in the second resistor circuit, and
        second connecting means for connecting another end of each of the plurality of switches in the second digital-to-analog conversion circuit;
    synthesizing means for synthesizing outputs of the first and second connecting means;
    a decoder for decoding the input digital data to control the switches in the first and second digital-to-analog conversion circuits; and
    a resistor connected in parallel with the second resistor circuit, the resistance of this resistor being so determined that a voltage applied between both ends of the first resistor circuit is more than a voltage applied between both ends of the second resistor circuit divided by $M/2^N$ (N represents the number of bits included in that portion of the input digital data which is processed by the first digital-to-analog conversion circuit, and M represents a ratio with which the outputs of the first and second connecting means are synthesized).

3. A digital-to-analog converter as claimed in claim 2, wherein the decoder comprises a decoder for the upper bits and a decoder for the lower bits.

4. A digital-to-analog converter comprising:
    means for dividing digital data consisting of L bits into an upper segment consisting of N bits and a lower segment consisting of (L−N) bits;
    a first digital-to-analog conversion circuit for performing digital-to-analog conversion on digital data of the upper segment;
    a second digital-to-analog conversion circuit for performing digital-to-analog conversion on digital data of the lower segment;

means for synthesizing an output from the first digital-to-analog conversion circuit and an output from the second digital-to-analog conversion circuit; and setting means for setting a full-scale output level of the first digital-to-analog conversion circuit and a full-scale output level of the second digital-to-analog conversion circuit, said setting means setting the full-scale output level of the second digital-to-analog conversion circuit to be greater than $½^N$ times the full-scale output level of the first digital-to-analog conversion circuit.

5. A control device comprising:

a reference signal generator, a digital-to-analog converter, a comparator for comparing an output from the digital-to-analog converter with a reference signal generated by the reference signal generator so as to control the digital-to-analog converter in accordance with a result of the comparison, wherein the digital-to-analog converter comprises:

means for dividing digital data consisting of L bits into an upper segment consisting of N bits and a lower segment consisting of (L–N) bits;

a first digital-to-analog conversion circuit for performing digital-to-analog conversion on digital data of the upper segment;

a second digital-to-analog conversion circuit for performing digital-to-analog conversion on digital data of the lower segment;

means for synthesizing an output from the first digital-to-analog conversion circuit and an output from the second digital-to-analog conversion circuit; and setting means for setting a full-scale output level of the first digital-to-analog conversion circuit and a full-scale output level of the second digital-to-analog conversion circuit, said setting means setting the full-scale output level of the second digital-to-analog conversion circuit to be greater than $½^N$ times the full-scale output level of the first digital-to-analog conversion circuit.

* * * * *